United States Patent
Xing

(10) Patent No.: US 7,152,071 B2
(45) Date of Patent: Dec. 19, 2006

(54) SHAPE-BASED GEOMETRIC DATABASE AND METHODS AND SYSTEMS FOR CONSTRUCTION AND USE THEREOF

(75) Inventor: Zhaoyun Xing, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 383 days.

(21) Appl. No.: 10/136,045

(22) Filed: May 1, 2002

(65) Prior Publication Data
US 2003/0208496 A1   Nov. 6, 2003

(51) Int. Cl.
*G06F 7/00* (2006.01)
(52) U.S. Cl. ............... 707/101; 707/100; 707/104.1
(58) Field of Classification Search ......... 707/1–104.1, 707/200–205
See application file for complete search history.

(56) References Cited

U.S. PATENT DOCUMENTS

| | | | |
|---|---|---|---|
| 5,520,388 A * | 5/1996 | Osborn .................. 273/157 R |
| 5,963,956 A * | 10/1999 | Smartt ..................... 707/104.1 |
| 5,987,460 A * | 11/1999 | Niwa et al. .................... 707/6 |
| 6,252,605 B1 * | 6/2001 | Beesley et al. ............. 345/441 |
| 6,301,797 B1 * | 10/2001 | Sundaram et al. ............ 33/645 |
| 6,349,309 B1 * | 2/2002 | Aggarwal et al. .......... 707/200 |
| 6,381,605 B1 * | 4/2002 | Kothuri et al. ............. 707/100 |
| 6,470,344 B1 * | 10/2002 | Kothuri et al. ............. 707/100 |
| 6,505,205 B1 * | 1/2003 | Kothuri et al. ............. 707/100 |
| 6,741,983 B1 * | 5/2004 | Birdwell et al. ................ 707/5 |
| 6,882,997 B1 * | 4/2005 | Zhang et al. .................. 707/6 |
| 2002/0151315 A1 * | 10/2002 | Hendrey ...................... 455/466 |
| 2002/0184607 A1 * | 12/2002 | Alpert et al. .................. 716/15 |

OTHER PUBLICATIONS

Gholamhosein Sheikholeslami, Surojit Chatterjee, Aidong Zhang, "WaveCluster: a wavelet-based clustering approach for spatial data in very large databases", The VLDB Journal, 2000, pp. 289-304.*
Zhaoyun Xing, Russell Kao, "A Minimum Cost Path Search Algorithm Through Tile Obstacles", ACM 2001, pp. 192-197.*
J. Cong, et al., An Implicit Connection Graph Maze Routing Algorithm for ECO Routing, Proc. ICCAD 1999, San Jose, CA, 4 pages.
A. Guttman, R-Trees: A Dynamic Index Structure for Spatial Searching, Proc. of ACM SIGMOD, 1984, Boston, MA, pp. 47-57.
T. Cormen, et al., Introduction to Algorithms, MIT Press, 1990, pp. 527-531.

* cited by examiner

*Primary Examiner*—Luke S Wassum
*Assistant Examiner*—Linh Black
(74) *Attorney, Agent, or Firm*—Zagorin O'Brien Graham LLP

(57) ABSTRACT

A shape-based geometric database uses R-trees to compactly and efficiently represent design objects. Such R-trees may be populated in an efficient and balanced manner to improve the efficient use of such R-trees in various stages of circuit design, for example. For example, tiles are assigned to bins depending at least partially on orientation of the tiles and on proximity of the tiles to reference tracks having similar orientations. Bin R-trees may be defined, along with direction and layer R-trees using a level sequential process from lower levels to higher levels until a root node is defined in each case.

33 Claims, 9 Drawing Sheets

SHAPE-BASED GEOMETRIC DATABASE AND METHODS AND SYSTEMS FOR CONSTRUCTION AND USE THEREOF

BACKGROUND

1. Field

The present invention relates to circuit design, and, more particularly, to systems and techniques for processing and storing information regarding circuit elements.

2. Description of the Related Art

Geometry databases (GDBs) are often used to support circuit design. A geometry database provides geometrical relationship information regarding elements of a design area to various functional modules of an automated design system. For example, during the physical design phase in a typical Very Large Scale Integration (VLSI) circuit design environment, such functional modules often need to access a geometry database to support inquiries about the geometrical relationships between rectangular tiles. For example, a detail router accesses a geometry database for track clearance queries. Other modules access geometry databases for other purposes.

One fundamental query that a geometry database typically supports is the area query. An area query finds a list of tiles which a rectangular area overlaps. Some other useful queries can be answered based on the area query. For instance, in a point search, the query finds a list of covering tiles for a given point. Because a point is a degenerate rectangle, this query can be answered by an area search. Similarly, in a line search, the query finds a list of overlapping tiles for a given line segment on a routing track, which can also be answered by an area search.

A geometry database may take many forms and may be constructed using many methods. One type of geometry database is called shape-based because the geometry database stores tiles directly using a data structure. One brute-force implementation of a shape-based geometry database is to use a linked-list. However, a linked-list is far from being efficient when performing queries. Other types of geometry databases may use random insertion techniques which force dynamic database restructuring and may result in overlapping bounding boxes in different branches, thereby adversely affecting search queries, for example.

Shaped-based GDBs have advantages over other GDB's such as track-based GDBs. Shape-based GDBs are compact because they do not fracture tiles and thus are memory efficient. For the same reason, they keep the integrity of each tile. Tile integrity is a useful feature for a wide range of application tools. For example, in detailed routing, wires may be ripped up. In this case, shape-based geometry databases can be easily maintained, whereas track-based geometry databases cannot. One type of shape-based geometry database uses slit-trees. In such a GDB, chip design area is partitioned into slits along a preferred routing direction. Tiles are inserted into a slit if they overlap with the slit. However, if a tile is running in a non-preferred routing direction then it will be inserted into multiple slits. This will result in a less memory efficient database.

An efficiently built geometry database aids efficiency and speed when handling queries during various design stages. Since the number of calculations performed during circuit design is ever increasing, the industry is always looking for improved techniques for building and using geometry databases, among other improvements.

BRIEF DESCRIPTION OF EMBODIMENT(S)

It has been discovered that a shape-based geometric database may use R-trees to compactly and efficiently represent design objects, and that such R-trees may be populated in an efficient and balanced manner to improve the efficient use of such R-trees in various stages of circuit design, for example.

In one embodiment of the present invention, a method is provided for processing spatial information regarding an area at least partially partitioned into a plurality of tiles. The method includes the step of assigning tiles to bins depending at least partially on orientation of the tiles and on proximity of the tiles to reference tracks having similar orientations. In a further embodiment, the method includes one or more of the following steps: defining a bin R-tree for each bin, each bin R-tree having leaf nodes corresponding to tiles in each bin; using bin R-trees to provide a geometry database representative of circuit elements in the circuit design area; defining first and second direction R-trees including each of the bin R-trees which corresponds to tracks oriented in the respective first and second directions; defining a layer R-tree including each of the bin R-trees and/or each of the layer R-trees; and associating root nodes of each of a plurality of layer R-trees to provide a global geometry database representative of circuit features in the circuit design. In yet a further embodiment, the method further includes at least one of creating a physical circuit design using the global geometry database, and searching the physical circuit design using the global geometry database.

In another embodiment of the present invention, a method of populating an R-tree data structure is provided. The R-tree data structure has branches representative of multi-dimensional tiles. The multi-dimensional tiles correspond to locations in an area referenced by tracks oriented in a direction corresponding to each dimension. The method includes determining an orientation of a tile, selecting a track corresponding to the tile and the orientation of the tile, and assigning the tile to a bin corresponding to the selected track. In a further embodiment, a substantially balanced R-tree data structure is populated according to the immediately foregoing method. Each internal level i, if any, of the R-tree data structure has $n_i$ nodes, and $(n_i-1)$ of the nodes at each branch level i have b number of branches to lower-level nodes when $n_i > b$. In yet a further embodiment, a physical circuit layout is represented at least in part by the R-tree data structure. Also, a geometry database includes the R-tree data structure in yet another embodiment. A design automation system may also include the geometry database. A physical circuit layout design automation system may be configured to populate an R-tree data structure in a geometry database according to the above method such that the R-tree data structure includes a root level including at least one circuit layer root node, a plurality of branch levels, wherein for each internal level i, the number of nodes $N_{i+1}$ at the next higher level i+1 that are fully associated with a branch number b of nodes in the currently selected level is defined by $N_{i+1} = \text{FLOOR}(n_i/b)$; and a leaf level including a plurality of leaf nodes representative of tiles in the area.

In yet another embodiment, a substantially balanced R-tree data structure is populated using track and tile orientation information, wherein for each internal level i, if any, of the R-tree data structure has $n_i$ nodes, and wherein $(n_i-1)$ of the nodes at each branch level i have b number of branches to lower-level nodes when $n_i > b$.

In yet another embodiment, a level-sequential method of populating an R-tree is provided. The method operates without node insertion and without tree restructuring. The method includes the step of generating a plurality of levels of an R-tree. Each level of the R-tree is generated in sequence from a lowest level to a root level, and each level is completed before generation of a next higher level.

In yet another embodiment, a method of processing spatial information for a circuit is provided. The spatial information includes a plurality of tiles representative of circuit features in a circuit design area. The method includes the steps of selecting a first direction in the circuit design area, selecting a reference track oriented in the first direction, providing a bin if any tiles are closer to the selected reference track than any other reference track and such tiles are oriented in the first direction, and assigning such tiles to the bin. In a further embodiment, the method further includes selecting a next reference track oriented in the first direction, providing a next bin if any unassigned tiles are closer to the selected reference track than any other reference track and such tiles are oriented in the first direction, and assigning such unassigned tiles to the next bin.

In yet a further embodiment, a method of processing spatial information is provided. The spatial information includes a plurality of tiles. The method includes the step of selecting one or more tiles based at least in part on at least one of the group consisting of a track corresponding to each tile, an orientation of each tile, and a spatial ordering of the tiles, and the step of associating each of the selected tiles with a corresponding R-tree node. In a further embodiment, the step of associating each of the plurality of tiles with an R-tree node includes the steps of providing a data structure configured to store an R-tree, generating an R-tree node corresponding to the selected tiles, and linking the R-tree node to selected tiles in the data structure. In yet a further embodiment, the step of selecting includes the steps of assigning one or more tiles to at least one of a plurality of bins, and sorting the tiles within each bin. In yet a further embodiment, the step of associating each of the plurality of tiles with an R-tree node includes the steps of providing a data structure configured to store an R-tree, generating at least one R-tree node corresponding to each bin, and linking the R-tree nodes to each of the corresponding bins. Further embodiments may include generation of direction and layer level R-trees and a global geometry database.

In yet another embodiment, a method includes the following steps: assigning each tile to at least one track bin; generating a track bin R-tree for each track bin; merging a first plurality of track bin R-trees into a first directional R-tree for a plurality of track bins corresponding to tracks substantially oriented in a first direction; merging a second plurality of track bin R-trees into a second directional R-tree for a plurality of track bins corresponding to tracks substantially oriented in a second direction; and merging the first and second directional R-trees into a layer R-tree.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art, by referencing the accompanying drawings. The use of the same reference symbols in different drawings indicates similar or identical items.

DETAILED DESCRIPTION OF EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

Figure 1:
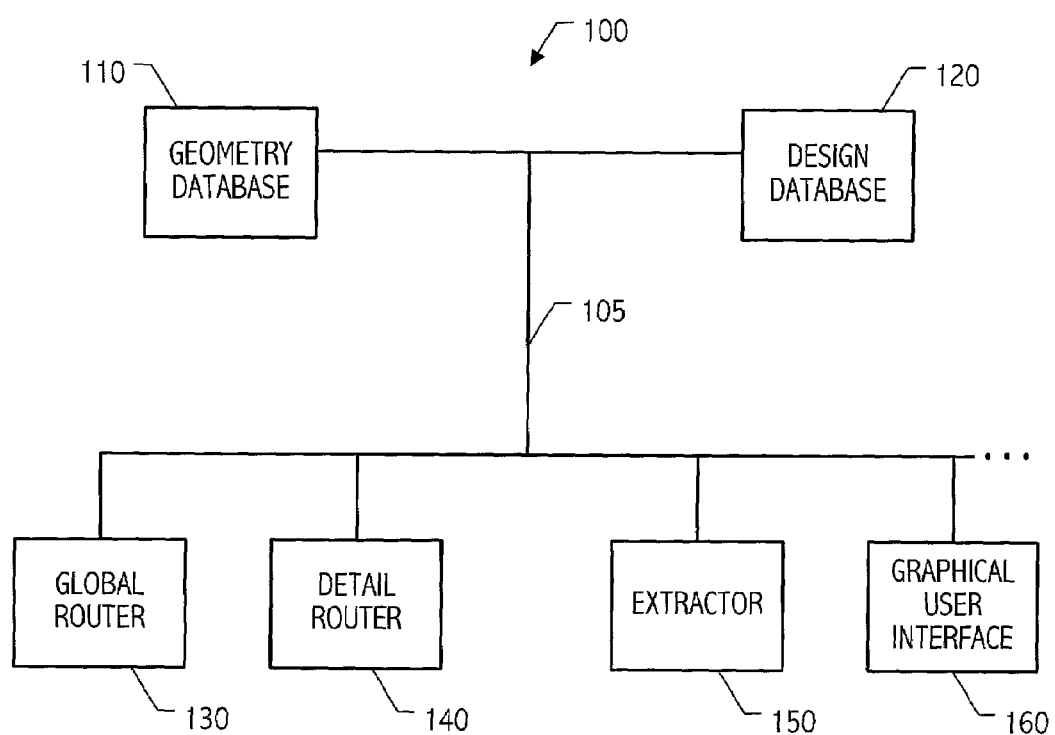
FIG. 1 is a block diagram illustrating an exemplary circuit design architecture and system including a geometry database in accordance with the invention.

FIG. 1 shows an automated design system 100 for use in designing integrated electronic circuits. System 100 includes geometry database 110, design database 120, global router 130, detail router 140, extractor 150, and graphical user interface 160, all of which are coupled to each other via coupling 105.

Geometry database 110 is a balanced, R-tree-based, shape-based geometry database which is advantageously designed using techniques described herein to facilitate the various functionalities of modules 130–160. Geometry database 110 provides geometrical relationship information regarding elements (e.g., tiles) of a design area to the various functional modules 130–160. For example, during the physical design phase in a typical Very Large Scale Integration (VLSI) circuit design environment, such functional modules often need to access an efficient geometry database such as geometry database 110 to support inquiries about the geometrical relationships between objects (e.g., rectangular objects such as tiles). The various modules 130–160 access geometry database 110 during various stages of physical design. For example, detail router 140 uses geometry database 110 for track clearance queries and accesses design database 120 for a design net list. Other modules access geometry database 110 and design database 120 for similar purposes.

Figure 2:
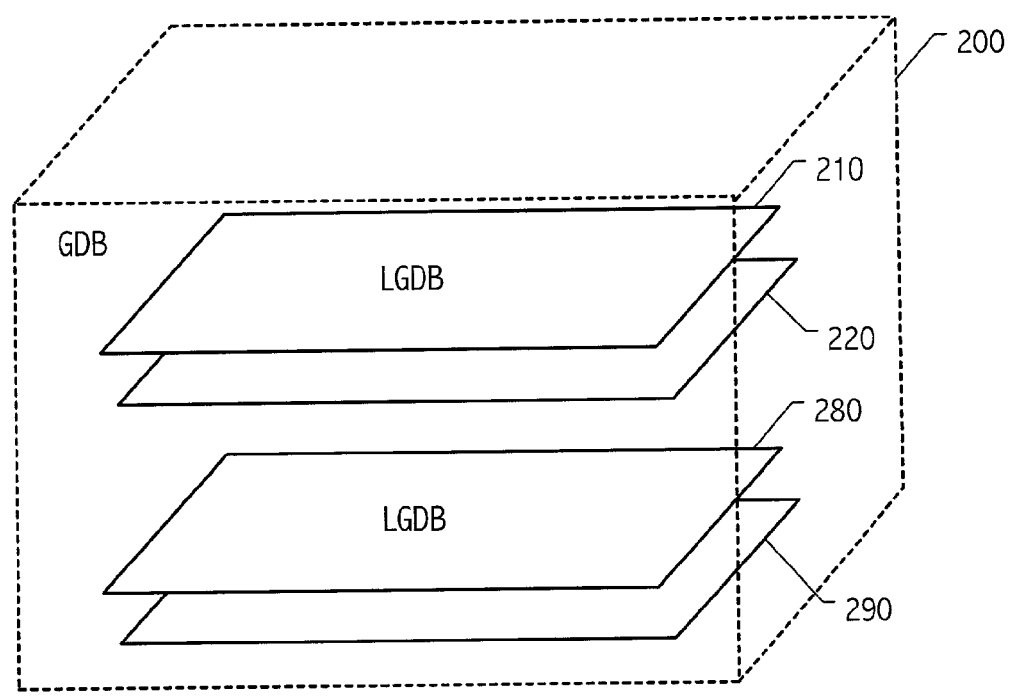
FIG. 2 is a perspective representation of a circuit and layers of a circuit corresponding to layer-geometry databases and a global geometry database in accordance with the invention.

In VLSI circuit design, an integrated circuit (IC) chip is generally composed of multiple layers, and each layer typically includes a collection of shapes. Those shapes may be wires on a routing layer or may be an active region in a diffusion area. On a given layer, two shapes typically overlap each other only if they are electrically connected (i.e., they are on the same net; see, e.g., tiles 311, 312 and 313 within layer 300 of FIG. 3). The function of geometry database 110 is to create an appropriate data structure for each collection of shapes and to support relationship queries regarding the shapes. Geometry database 110 includes a set of geometry databases for each layer. For example, as shown in FIG. 2, geometry database 200 includes layer geometry database (LGDB) 210, LGDB 220, LGDB 280 and LGDB 290. Each layer geometry database is representative of a physical layer within an integrated circuit design. Geometry database 200 may include other layer geometry databases not shown in FIG. 2.

Figure 3:
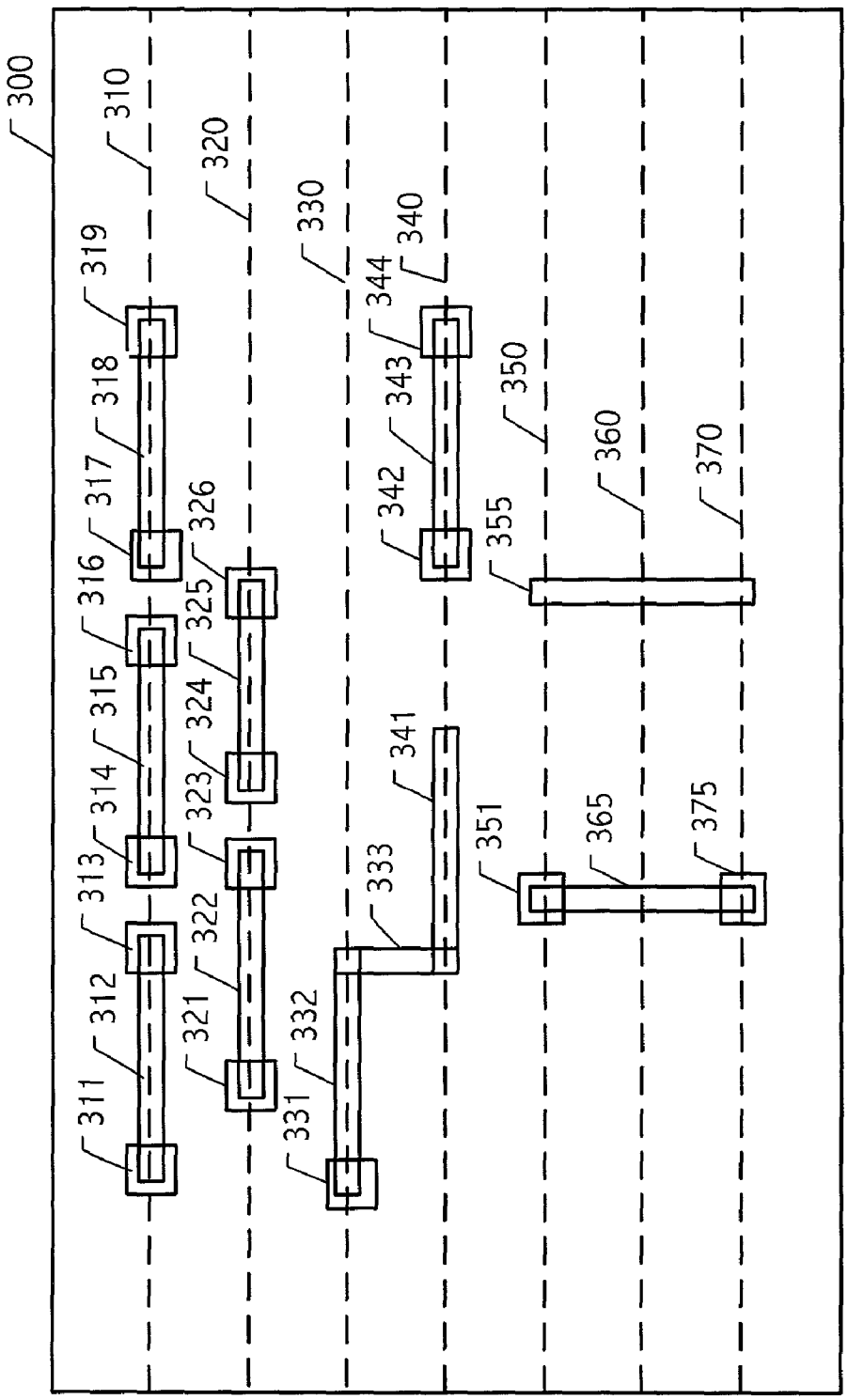
FIG. 3 is a block diagram of a circuit layer of FIG. 2.

FIG. 3 shows an exemplary geometry database tile input pattern 300 which includes a tile input pattern for a given layer within a VLSI circuit. In general, tiles do not overlap or only overlap a few other tiles. Most of the tiles within layer 300 are oriented in a particular direction, which is called the preferred direction. Some tiles are oriented in other directions, for example, in a non-preferred direction. In the case shown in FIG. 3, the preferred direction is horizontal, as shown by exemplary tiles 311–326, for example, and the non-preferred direction is vertical as shown by tiles 351–355, for example.

As shown in FIG. 3, the tiles are aligned and grouped together by reference tracks (or simply tracks). Layer 300 includes exemplary reference tracks 310, 320, 330, 340, 350, 360 and 370. Tiles on each track typically overlap with only a few other tiles and any overlapping area is typically very small. When tiles are grouped within a particular reference track, the bounding box surrounding each grouping of tiles is typically smaller than if the tiles were grouped without regard to their corresponding reference tracks. Accordingly, tiles are advantageously grouped within bins which correspond to reference tracks within each layer.

Figure 4:
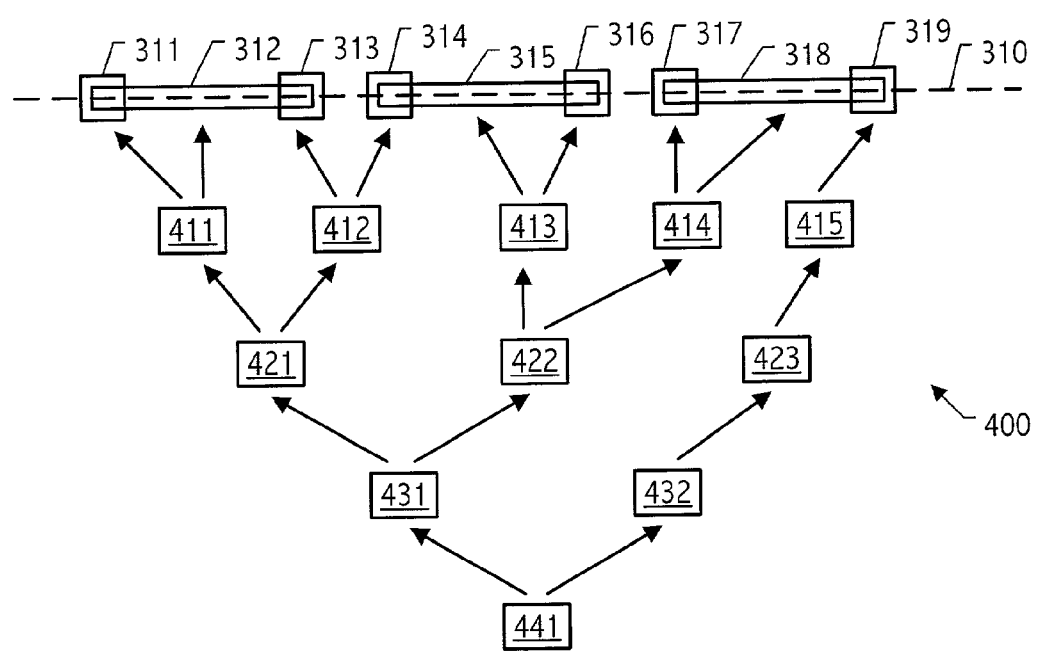
FIG. 4 is a block diagram showing an R-tree corresponding to a track of FIG. 3.

FIG. 4 shows exemplary reference track 310 and corresponding tiles 311–319 associated with an R-tree 400. An R-tree is a data structure which is created and used for storing spatial or multi-dimensional objects in database applications. Any objects with a rectangular footprint can be stored in an R-tree, for example. One possible application is to use R-trees to store maps. As used in the presently discussed embodiment, R-tree 400 is used to store circuit element data in a VLSI design environment.

R-tree 400 is a height-balanced tree, with all objects stored in leaf nodes. The branch number of each internal node is maintained in a range between its minimum branch number and the maximum branch number. The minimum branch number is used to keep the tree from being underpopulated and degenerate into a linked-list. In general, the minimum branch number is half of the maximum branch number. For instance, if the maximum branch number is 8, then the minimum branch number is 4. In FIG. 4, the full or maximum branch number is 2 and the partial or minimum branch number is 1.

All nodes (leaf and internal) store the bounding box of all leaf objects under each node. This bounding box can be computed from the direct children of each node. When doing an area search query, this box will be used to trim out tree branches which do not overlap with the searched area. Therefore, a better R-tree tries to minimize the overlap of its children as much as possible. When performing an area search, system 100 starts from the root and continues the area search into all child nodes which have overlapping bounding boxes. To reduce tile overlap and to reduce corresponding bounding box size, neighboring tiles on reference track 310 are inserted into corresponding R-tree nodes of a bin R-tree 400.

As shown in FIG. 4, adjoining tiles 311 and 312 are represented as leaf nodes associated with an internal R-tree node 411. Neighboring tiles 313 and 314 are represented as leaf nodes associated with internal R-tree node 412. This process continues for the remaining tiles within reference track 310 until all of the tiles within track 310 are associated with an R-tree node. Each time, a branch number of tiles are selected for association with an R-tree node. In this example, the branch number b=2. Next, the R-tree nodes of R-tree 400 are associated with corresponding higher-level, internal R-tree nodes until there is a single root R-tree node (e.g., root node 441) for all tiles within reference track 310, as shown in FIG. 4. Here again, the branch number is two, so that no more than two tiles or intermediate nodes are associated with a higher level node.

This results in a substantially balanced R-tree. For example, all (or all minus one) of the nodes of each level is associated with no more than the branch number of lower nodes. For each level (e.g., a currently selected level) except for the root level, the number of nodes N at the next higher level that will be fully associated (i.e., with a branch number b of nodes in the currently selected level) is provided by the following equation: $N=\text{FLOOR}(n_i/b)$. For example, in FIG. 4, the branch number b=2. Assuming a currently selected level including the five nodes 411–415, the number of the three higher-level nodes 421–423 which are fully associated with 2 lower-level nodes is $\text{FLOOR}(5/2)=\text{FLOOR}(2.5)=2$. In this case, the two fully associated nodes are 421 and 422. Only one node in each level is only partially associated (e.g., associated with less than the branch number b of lower-level nodes). R-tree 400 is a balanced and compact R-tree which can be very useful in searches of the R-tree as the overlap of bounding boxes corresponding to nodes is minimized because the bounding box roughly correlates to the height and length of a track. Memory usage is also minimized by such a structure.

In VLSI designs, there are large number of tiles on each layer. Many of those tiles are blockages from the previous design hierarchies. Therefore, the geometry database should be efficient for area search, and it should have a short building time. If the GDB is R-tree based, the efficiency typically depends only on the quality of the R-tree. A primary factor in the quality of an R-tree is the sum of overlapping area of bounding boxes of the children of all internal nodes. The smaller the bounding box sum, the fewer the number of nodes to explore.

A geometry database including R-tree constructed according to the methods provided herein typically has faster construction time due the absence of insertion location decisions and a lack of node overflow with consequent restructuring. The bin assignment technique described herein results in faster building of geometry databases because of the ease of determining the order of tiles within track bins, for example. Also, such a geometry database has the quality that there is little overlap of bounding boxes so that search queries are handled more efficiently.

Figure 5:
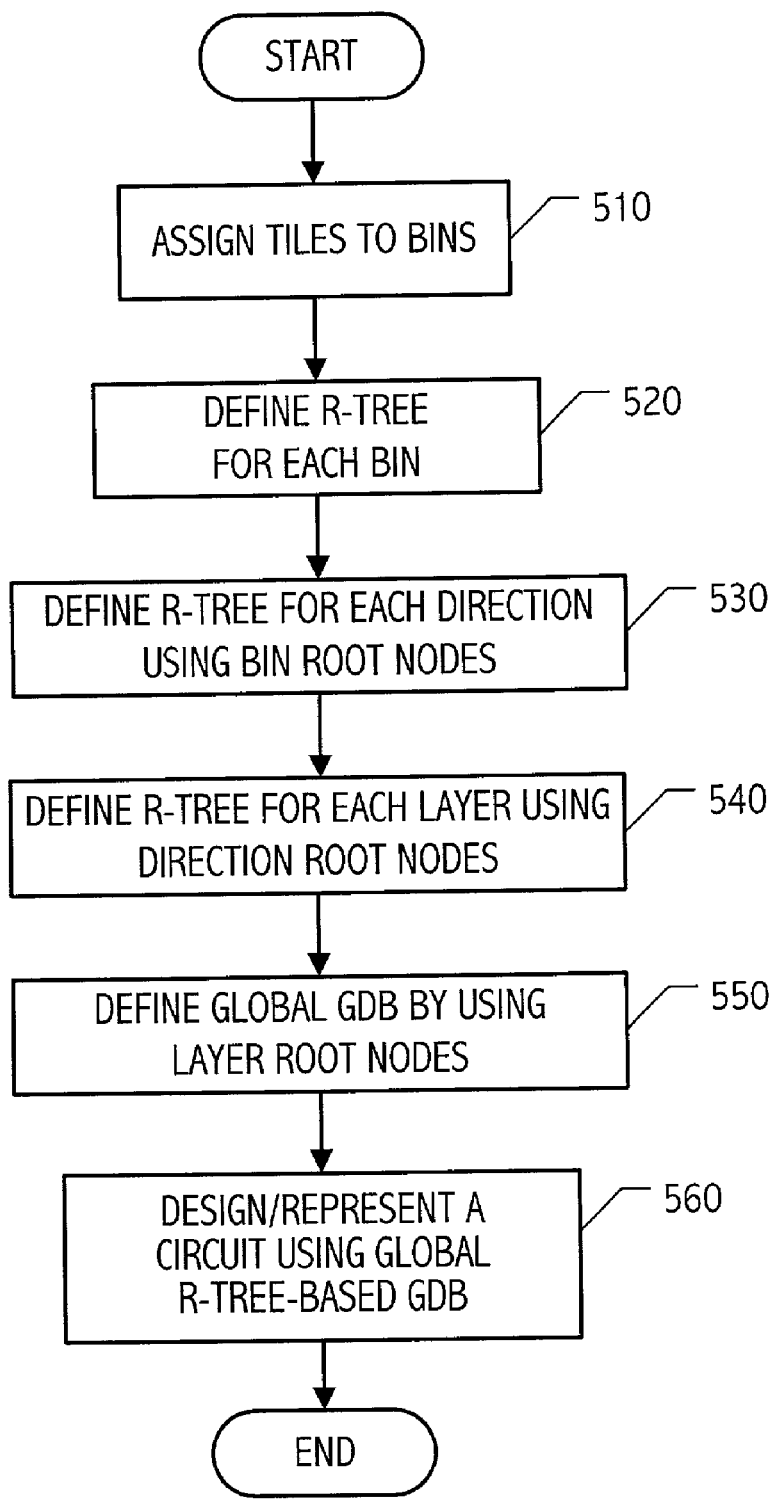
FIG. 5 is a flow chart showing one embodiment of a process for generating and using a shape-based global geometry database in accordance with the invention.

FIG. 5 shows an exemplary method of generating a geometry database for integrated circuit design. During step 510, tiles within the circuit design are assigned to bins. The bins are associated with reference tracks within each layer of the circuit design. After step 510, an R-tree is defined for each bin during define bin step 520 as described above with reference to FIG. 4 and in further detail below. After define bin R-tree step 520, an R-tree is defined for each direction using root nodes of the various bins defined during step 530. For example, a preferred direction R-tree is defined, followed by a non-preferred direction R-tree, during define direction R-trees step 530. After define direction R-trees step 530 and during define layer R-trees step 540, an R-tree is defined for each layer using the root nodes of the direction R-trees in each layer which were initially defined during step 530. After define layer R-trees step 540 and during define global geometry database step 550, the global geometry database is defined so that all layers within the design are associated with each other. This may be done using an R-tree as described herein, but it is typically sufficient to associate the layer root nodes using a simple linked list or hash table. After define global geometry database step 550, the global R-tree-based geometry database may be used to design and/or represent a circuit during step 560.

Figure 6:
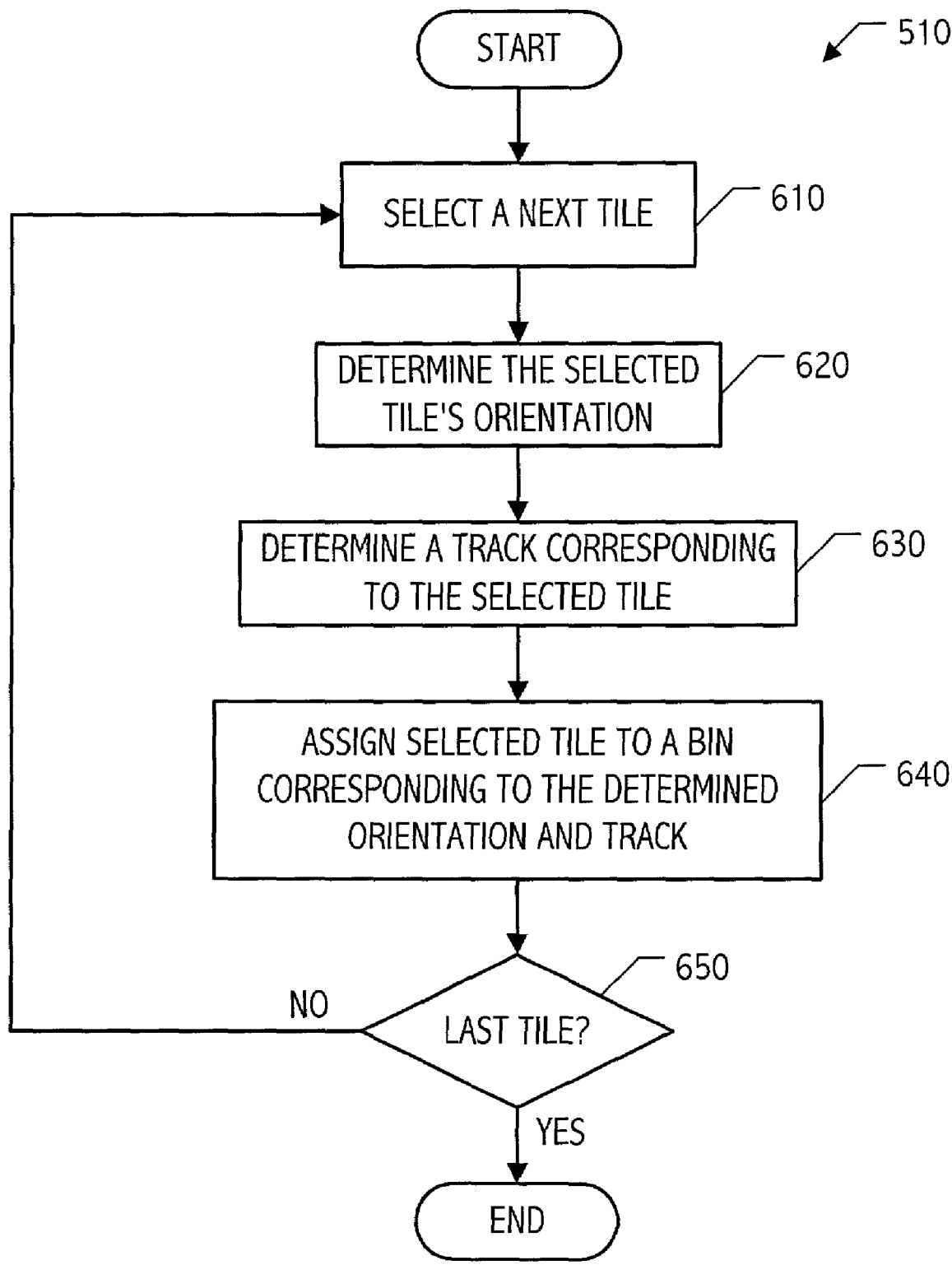
FIG. 6 is a flow chart showing one embodiment of a process for assigning tiles to bins in accordance with the invention.

FIG. 6 shows one exemplary process for assigning tiles to bins as is performed during step 510 of FIG. 5. As shown in FIG. 6, each tile is selected in turn until all tiles have been selected. Certain determinations are made regarding the characteristics of each selected tile. Each tile is assigned to a bin according to the results of those determinations. If there is no tile corresponding to a reference track, no bin is generated.

For example, a tile is selected during select next tile step 610. After select next tile step 610 and during determine orientation step 620, the orientation of the selected tile is determined. For example, the tile may be oriented in a preferred direction or in a non-preferred direction. The direction may be in one of two orthogonal directions, or it may be one of more than two directions. For example, the direction may be at a 45 degree angle to two orthogonal directions. After determine orientation step 620 and during determine track step 630, information regarding the selected tile is processed to determine which track corresponds to the selected tile within the layer of the tile. For example, as shown in FIG. 3, tiles 311–319 correspond to track 310, tiles 321–326 correspond to track 320, tiles 331 and 332 correspond to track 330.

After determine track step 630 and during bin assignment step 640, the selected tile is assigned to a bin which corresponds to the orientation and track determined during steps 620 and 630. A bin is a virtual, temporary container for a collection or set of tiles which will eventually be placed within an R-Tree data structure in geometry database 110. Geometry database 110 is configured to store information regarding spatial elements with a design area, a portion of which is represented by layer 300 in FIG. 3.

After bin assignment step 640 and during last tile decision 650, system 100 determines whether each tile has been assigned to a bin. If there are remaining tiles which have not been assigned to a bin, control transitions from decision 650 back to select the next tile step 610. This process is repeated until every tile has been associated with a bin. Note that this loop and process order is exemplary, and other types of looping mechanisms may be used to ensure that an appropriate number of tiles are assigned to appropriate bins, and the order of steps and the functionality of specific steps may vary from embodiment to embodiment.

Figure 7:
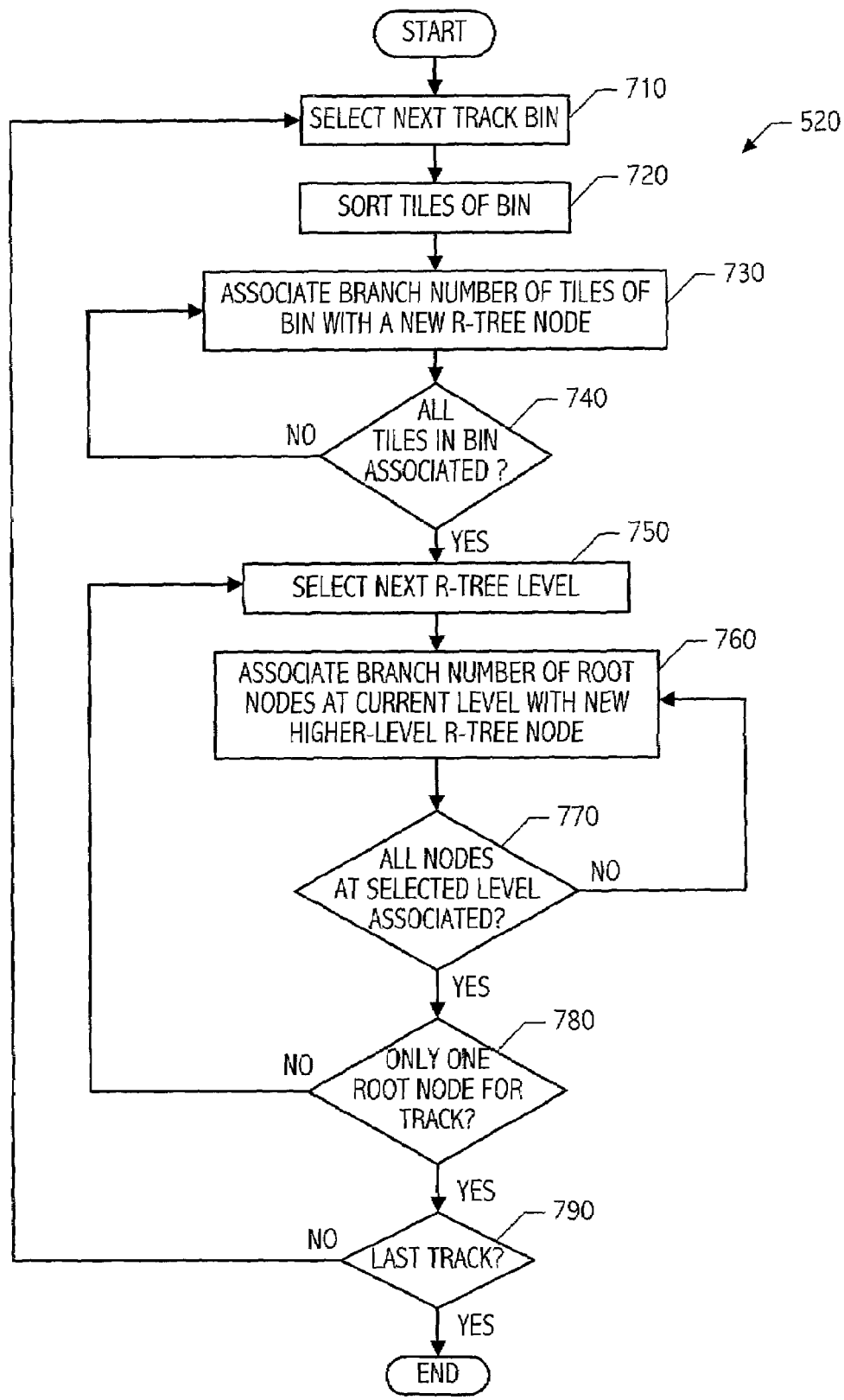
FIG. 7 is a flow chart showing one embodiment of a process for generating track bin R-trees in accordance with the invention.

FIG. 7 shows one exemplary process for generating track bin R-trees as is performed during step 520 of FIG. 5. As shown in FIG. 7, each track bin is selected in turn until all track bins have been selected. For each bin, the tiles of that bin are sorted, and sets of a programmable number of tiles each are merged or associated with R-tree nodes, thereby establishing a first layer within an eventual R-tree structure. The R-tree nodes within each bin are further associated with an R-tree structure until all of the tiles in a bin are traceable through a resulting R-tree to a single R-tree root node. This is shown, for example, by FIG. 4 in which all of the tiles of the bin which corresponds to track 310 are associated with a single root node 441. This process is repeated for each track.

Thus, merging starts with tiles, and assuming b is the desired branch number of each R-tree node, every b tiles on the track will be merged to generate one or more internal R-tree nodes. The bounding boxes of those R-tree nodes are roughly sorted and can be merged again to make new set of internal nodes. Because every time the number of nodes remaining is only 1/b of the previous merging, this process terminates when there is only one node.

Referring again to FIG. 7, a track bin is selected during select track bin step 710. After select track bin step 710, the tiles of the selected bin are sorted during sort step 720. Tiles may be sorted, for example, by using the spatial location of their left and bottom corners in the direction of the reference track. Thus, for example, the tiles in FIG. 4 of track 310 are sorted from right to left.

After sort step 720 and during associate tile step 730, a programmable branch number of tiles are associated with a new R-tree node. For example, with a branch number of four, four neighboring tiles of a bin are selected to be associated with a new R-tree node of a track bin R-tree. After associate tile step 730 and during decision 740, system 100 determines if all tiles within a bin have been associated with R-tree nodes. If the selected track bin includes tiles which have not been associated with an R-tree node, control transitions back to associate tile step 730 until all tiles in the bin have been associated with an R-tree node. FIG. 4 shows an example in which the branch number is two. No more than two tiles are associated with each of nodes 441–415 of R-tree 400. Referring again to FIG. 7, once all tiles in a bin have been associated with an R-tree node, control transitions from decision 740 to select next R-tree level step 750.

After a next R-tree level is selected during select next R-tree level step 750, a branch number of root nodes at the current R-tree level are associated with an R-tree node of the selected, new, higher R-tree level during associate root nodes step 760. After associate root nodes step 760 during decision 770, system 100 determines whether all nodes that are selected R-tree level have been associated. If there are remaining nodes that have not been associated, control transitions back to associate root node step 760. FIG. 4 shows an example in which the branch number is two. No more than two internal nodes are associated with another, higher-level node of R-tree 400. For example, nodes 411 and 412 are associated with higher-level node 421, which in turn is not associated with any other lower-level internal nodes. Root node 441 is the highest-level node for the track bin R-tree 400, and is only associated with two internal nodes 431 and 432. Of course, different branch numbers may be selected, in which case each node may be associated with a different number of lower-level nodes. Once all nodes of a selected R-tree level have been associated with a higher-level node, control transitions from decision 770 to decision 780.

During decision 780, system 100 determines if only one root node for a track exists. If there remains more than one root node for a track, control transitions back to select R-tree level step 750. Steps 750, 760 and 770 are repeated until there is only one root node for the selected track.

Once system 100 determines that there is only one root node for the selected track, control transitions from decision 780 to decision 790. During decision 790, system 100 determines if all tracks have been associated with an R-tree with only one root node. If there are remaining tracks which have not been associated with R-tree, control transitions back to select next track bin step 710. Once all tracks have been associated with a single corresponding root node, the loop is exited.

After the root internal R-tree node on each track bin is generated, those root nodes can be merged in a manner similar to the merging of nodes within the same track bin. When this process terminates, there is only one R-tree node that is the root of the sub-R-tree of all tiles oriented in one direction. In general, there should not be many tiles on a routing layer in non-preferred routing direction. If such tiles exist, a root R-tree node is generated for the non-preferred direction in a similar manner as for tiles in the preferred direction. The two direction root nodes will be merged again to form the R-tree for this layer.

Figure 8:
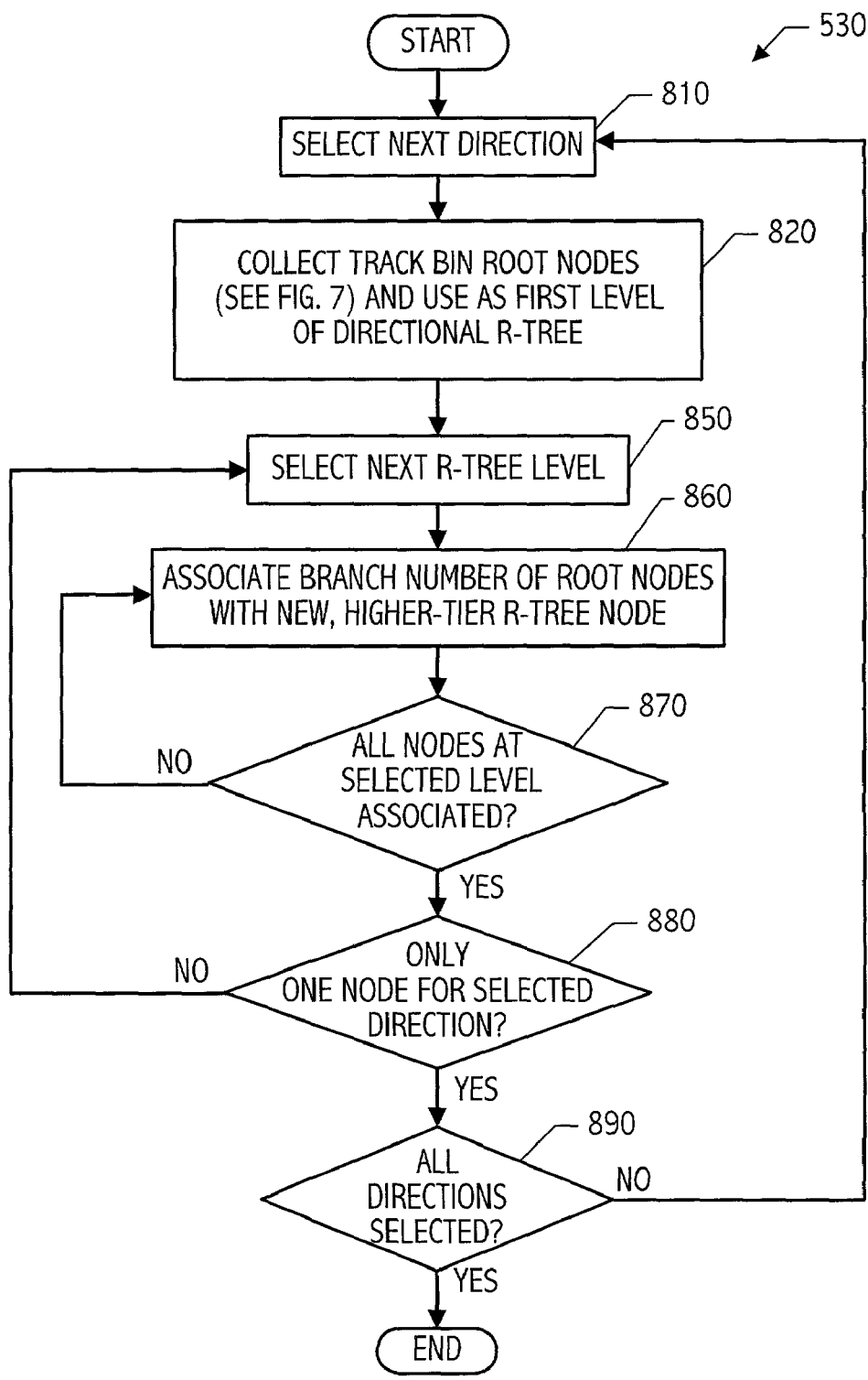
FIG. 8 is a flow chart showing one embodiment of a process for generating direction R-trees in accordance with the invention.

FIG. 8 shows one exemplary process for generating direction R-trees as is performed during step 530 of FIG. 5. As shown in FIG. 8, a loop from steps 810-890 is shown which ensures that a root node is generated for each direction within the search design. As shown in FIG. 8, each direction is selected in turn until all directions have been selected. FIG. 8 shows an embodiment which is generalized to satisfy more than two directions, but typical embodiments will include only two primary directions, and therefore only two executions of the aforementioned loop. For each direction, sets of a programmable number of track bin root nodes each are associated with R-tree nodes, thereby establishing a first layer within an eventual direction R-tree structure. The direction R-tree nodes corresponding to each direction are further associated with an R-tree structure until all of the tiles which correspond to tracks oriented in the selected direction are traceable through a resulting R-tree to a single R-tree root node for the direction within a layer. This process is repeated for each direction. Thus, referring to FIG. 3, tiles 311–319, 321–326, 331, 332 and 341–344 will be associated with a root node of an "X" or "horizontal" direction R-tree, and tiles 333, 351, 355, 365 and 375 will be associated with a root node of a "Y" or "vertical" direction R-tree.

After a direction is selected during select next direction step 810 and during track bin root node association step 820, the track bin root nodes defined after step 790 are collected and used as a starting level for a higher-level, direction R-Tree. The track bin root nodes (already root nodes of their own respective track bin R-Tree) are associated with higher-level R-Tree nodes in the direction R-Tree. For example, a branch number of track bin root nodes may be selected from track bins having the selected directional orientation. The selected track bin root nodes are then associated with a new higher-level R-tree node. System 100 then determines whether all track bin root nodes have been associated with higher-level R-tree nodes. The process may then be repeated until there are no remaining track bin root nodes which have not been associated with higher-level R-tree nodes. Once all track bin root nodes have been associated with higher-tier R-tree nodes, control transitions from decision 820 to select next R-tree level 850.

After a next R-tree level has been selected during step 850, a branch number of root nodes is associated with a new higher-tier R-tree node during step 860. After step 860 and during decision 870, system 100 determines whether all nodes at the selected level have been associated with a higher level R-tree node. If there are remaining nodes at the selected level which have not been associated with a higher level R-tree nodes, control transitions from decision 870 to step 860. This loop is repeated until all nodes at the selected level have been associated, at which time control transitions from decision 870 to decision 880.

During decision 880, system 100 determines if there is only one node for the selected direction. If there is more than one root node which is not associated with an higher-level node, control transitions from decision 880 to step 850 to select the next R-tree level. If there is only one node not associated with a higher-level node (e.g., a root node) for the selected direction, a complete R-tree with one root node has been defined for the selected direction within a design layer, and control transitions from decision 880 to decision 890.

During decision 890, system 100 determines whether all directions have been selected. If there are additional directions for which a root node has not been generated, control transitions from decision 890 to select next direction step 810. Once all directions have been selected, and therefore, a root node for each direction within each layer has been generated, the loop is exited. In a circuit design in which there are only two directions, this loop will be executed twice.

Figure 9:
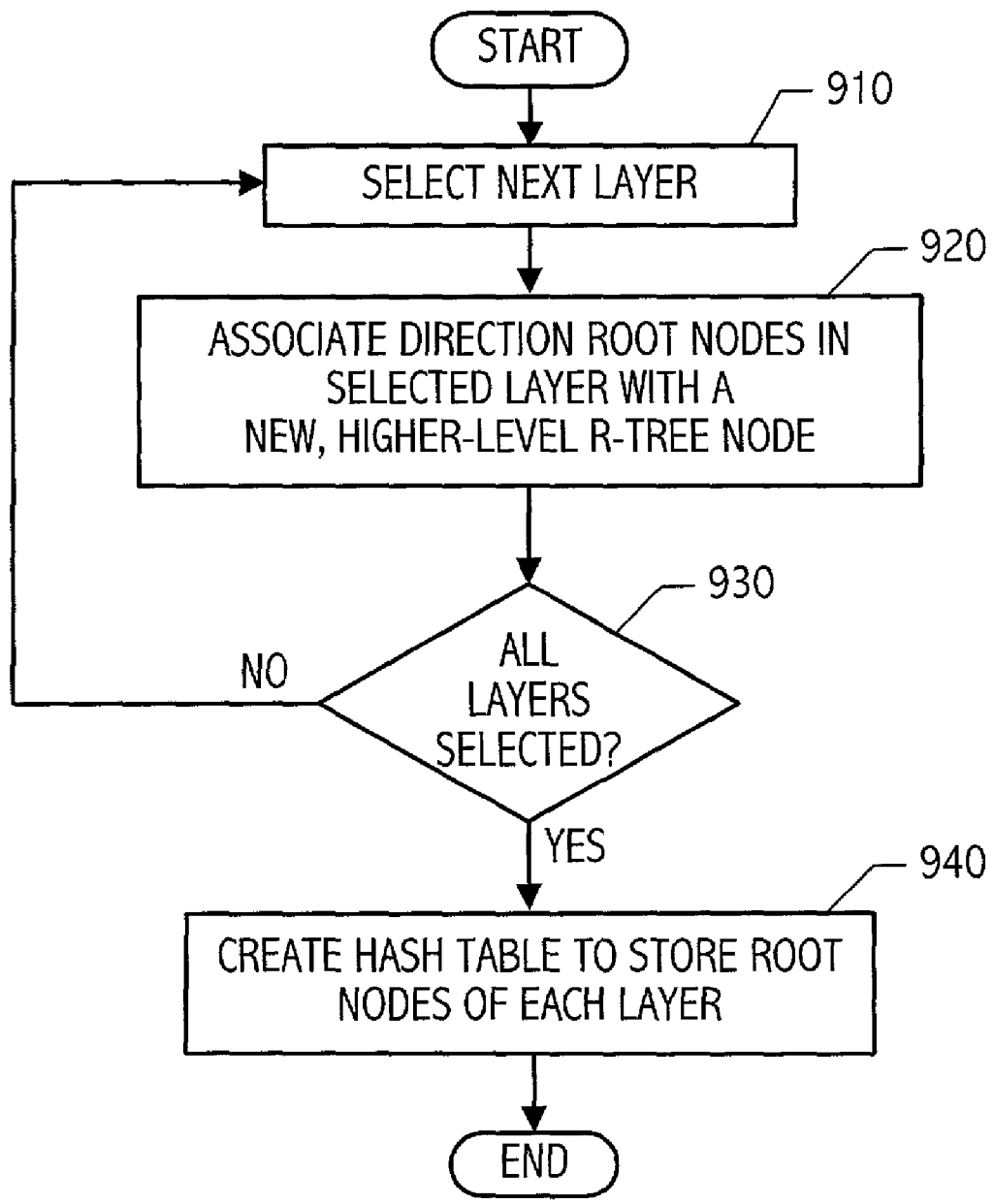
FIG. 9 is a flow chart showing one embodiment of a process for generating a global R-tree in accordance with the invention.

FIG. 9 shows one exemplary process for generating an R-tree for each layer within a geometry database and for associating each layer R-tree as is performed during steps 540 and 550 of FIG. 5. As shown in FIG. 9, a layer is selected during select next layer step 910. After select next layer step 910, certain direction root nodes within the selected layer are associated with a new higher-level R-tree node. Because the embodiment shown uses only two primary directions, and because the branch number is at least two, only one association step need be completed to fully define a layer R-tree. Other embodiments may use more steps to completely define a layer R-tree depending on the number of primary directions and depending on the branch number chosen for that portion of the R-tree.

After associate step 920 and during decision 930, system 100 determines whether all layers have been selected. If there are remaining layers which have not been selected and for which a root node has not been generated, control transitions from decision 930 to select next layer step 910. This loop is repeated until all layers have been selected.

Once all layers have been selected and a root node has been generated for each layer, control transitions from decision 930 to create hash table step 940. During create hash table step 940, a hash table is created to store the root nodes of each layer. This is done to associate the root nodes of each layer in order to generate a global geometry database for the overall circuit design. Other means of associating the layer root nodes may be used, including any type of linked list. An R-tree association may also be used similar to other R-tree associations described above, but since different layers overlap, the bounding boxes of the layers overlap, and there may be no inherent search improvement from using an R-tree association at this stage.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

For example, although the above embodiments relate to VLSI circuit design, other scales of circuit integration are equally applicable such as SSI, MSI, LSI, ULSI, etc. Also, In VLSI design, it is typically sufficient to consider only rectangular shapes. However, in the near future, diagonal routing wires are likely to be commonly fabricated instead of merely used in custom layout. GDB 110 is designed for physical design automation tools with large number of shapes and a high degree of automation. Therefore, the above discussion assumed GDB 110 stored only rectangular objects. A rectangle on a given design layer is called a tile. Therefore, GDB 110 is a tile GDB. From the detail design of GDB 110 discussed herein, one of ordinary skill in the art can appreciate that a tile GDB may be generalized to a general shape GDB using the bounding box of the shapes.

The foregoing methods may be used to build high quality R-trees. Because tiles are sorted first, the overlaps are minimized when tiles are merged. For the same reason, the bounding boxes in the subsequent merging phase are tight, if not optimally tight. Therefore, the generated R-tree for each bin has high quality. Using the same argument, we can generate an R-tree with close to minimal overlaps in internal R-tree node bounding boxes. Also, because we can get a uniform branch number for each internal R-tree, the tree is more balanced than the one generated by insertion, where the branch number of an internal R-tree node is controlled by how its child nodes overflow. Also, the tree building methods discussed herein can provide efficiency. The conventional tree building process inserts tiles one by one, and the heuristics commnonly used to reduce sibling-bounding box overlap slows down the building process.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

For example, those skilled in the art will recognize that boundaries between the functionality of the above described operations are merely illustrative. The functionality of multiple operations may be combined into a single operation, and/or the functionality of a single operations may be distributed in additional operations. Moreover, alternative embodiments may include multiple instances of a particular operation, and the order of operations may be altered in various other embodiments.

The operations discussed herein may consist of steps carried out by system users, hardware modules and/or software modules. In other embodiments, the operations of FIGS. 5-9, for example, are directly or indirectly representative of software modules resident on a computer readable medium and/or resident within a computer system and/or transmitted to the computer system as part of a computer program product. Thus, the operations referred to herein may correspond to modules or portions of modules (e.g., software, firmware or hardware modules, or combinations thereof). The functionality of operations referred to herein may correspond to the functionality of modules or portions of modules in various embodiments.

Those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes. Moreover, alternative embodiments may combine multiple instances of a particular module or submodule.

The above described method, the operations thereof and modules therefor may be executed on a computer system configured to execute the operations of the method and/or may be executed from computer-readable media. Computer systems may be found in many forms including but not limited to mainframes, minicomputers, servers, workstations, personal computers, notepads, personal digital assistants, various wireless devices and embedded systems, just to name a few. A typical computer system includes at least one processing unit, associated memory and a number of input/output (I/O) devices. A computer system processes information according to a program and produces resultant output information via I/O devices. A program is a list of instructions such as a particular application program and/or an operating system. A computer program is typically stored internally on computer readable storage media or transmitted to the computer system via a computer readable transmission medium. A computer process typically includes an executing (running) program or portion of a program, current program values and state information, and the resources used by the operating system to manage the execution of the process. A parent computer process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

The method described above may be embodied in a computer-readable medium for configuring a computer system to execute the method. The computer readable media may be permanently, removably or remotely coupled to system 100 or another system. The computer readable media may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and data transmission media including permanent and intermittent computer networks, point-to-point telecommunication equipment, carrier wave transmission media, the Internet, just to name a few. Other new and various types of computer-readable media may be used to store and/or transmit the software modules discussed herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method of processing spatial information encoded in computer readable form as a data structure for representing an area at least partially partitioned into a plurality of tiles, the method comprising the step of:
   assigning tiles to bins depending at least partially on orientation of the tiles and on proximity of the tiles to reference tracks having similar orientations.

2. The method of claim 1 further comprising the steps of:
   defining a plurality of tile R-trees, each tile R-tree having leaf nodes corresponding to tiles in each bin; and
   defining a bin R-tree for each bin, each bin R-tree including at least one branch node corresponding to a root node of one of the tile R-trees.

3. The method of claim 1 further comprising the step of:
   defining a bin R-tree for each bin, each bin R-tree having leaf nodes corresponding to tiles in each bin.

4. The method of claim 3 wherein the area is a circuit design area, the method further comprising the step of:
   using bin R-trees to provide a geometry database representative of circuit elements in the circuit design area.

5. The method of claim 3 further comprising the step of:
   defining a first direction R-tree including each of the bin R-trees which corresponds to tracks oriented in a first direction.

6. The method of claim 5 further comprising the step of:
   defining a second direction R-tree including each of the bin R-trees which corresponds to tracks oriented in a second direction.

7. The method of claim 6 wherein the first and second directions are orthogonal.

8. The method of claim 6 further comprising the step of:
   defining a multi-directional R-tree including each of the first and second direction R-trees.

9. The method of claim 3 further comprising the step of:
   defining a layer R-tree including each of the bin R-trees, wherein the layer R-tree corresponds to a layer of a circuit design.

10. The method of claim 9 further comprising the step of:
    associating root nodes of each of a plurality of layer R-trees to provide a global geometry database representative of circuit features in the circuit design.

11. The method of claim 10 wherein the root nodes of each layer R-tree are associated using one of the group consisting of a linked list and a global R-tree.

12. The method of claim 10 further comprising the step of:
    creating a physical circuit design using the global geometry database.

13. The method of claim 12 further comprising the step of:
    searching the physical circuit design using the global geometry database.

14. The method of claim 1, wherein the tiles are multi-dimensional and further comprising populating an R-tree data structure having branches representative of the multi-dimensional tiles in an area referenced by those of the tracks oriented in a direction corresponding to a particular dimension.

15. The method of claim 14 wherein the step of determining the orientation of the tile comprises the steps of:
    examining orthogonal dimensions of a tile to determine a longest dimension of the tile; and
    selecting a direction corresponding to the longest dimension of the tile.

16. The method of claim 14 further comprises the steps of:
    providing a first plurality of tracks in a first direction across the area to provide a reference for tiles in the area; and
    providing a second plurality of tracks in a second direction orthogonal to the first direction across the area to provide a reference for tiles in the area; and wherein the step of selecting the track includes the steps of:
    determining which of the first and second plurality of tracks is closest to a center of the tile; and determining which of the first and second plurality of tracks is oriented in a direction corresponding to the longest dimension of the tile.

17. The method of claim 14 further comprising the step of:
selecting a second tile and repeating the determining, selecting and assigning steps using the selected second tile.

18. The method of claim 14 further comprising the steps of:
providing the bin; and
assigning to the bin all of tiles which correspond to the selected track.

19. A substantially balanced R-tree data structure, encoded in a computer readable medium populated according to the method of claim 14, wherein for each internal level i, if any, of the R-tree data structure has $n_i$ nodes, and wherein ($n_i-1$) of the nodes at each branch level i have b number of branches to lower-level nodes when $n_i > b$.

20. The R-tree data structure encoded in a computer readable medium of claim 19 wherein b is a multiple of 2.

21. A physical circuit layout represented at least in part by the R-tree data structure encoded in a computer readable medium of claim 19.

22. A geometry database including the R-tree data structure of claim 19.

23. A design automation system including the geometry database of claim of claim 22.

24. A physical circuit layout design automation system configured to populate an R-tree data structure in a geometry database encoded in a computer readable medium according to the method of claim 14 such that the R-tree data structure comprises:
a root level including at least one circuit layer root node;
a plurality of branch levels, wherein for each internal level i, the number of nodes $N_{i+1}$ at the next higher level i+1 that are fully associated with a branch number b of nodes in the currently selected level is defined by $N_{i+1}=\text{FLOOR}(n_i/b)$; and
a leaf level including a plurality of leaf nodes representative of tiles in the area.

25. A physical circuit layout design automation system configured to populate a R-tree data structure in a geometry databade encoded in a computer readable medium of claim 24 wherein
the root level includes a plurality of circuit layer root nodes; and
the geometry database includes a linked list of the circuit layer root nodes.

26. A method of processing spatial information for a circuit, the spatial information including a plurality of tiles representative of circuit features in a circuit design area, the method comprising the steps of:

selecting a first direction in the circuit design area;
selecting a reference track oriented in the first direction;
providing a bin if any tiles are closer to the selected reference track than any other reference track and such tiles are oriented in the first direction; and
assigning such tiles to the bin.

27. The method of claim 26 further comprising the steps of:
sorting the tiles in a first bin depending on a relative spatial location of the tiles;
associating a plurality of tiles in the first bin with an R-tree node.

28. The method of claim 26 further comprising the steps of:
selecting a next reference track oriented in the first direction;
providing a next bin if any unassigned tiles are closer to the selected reference track than any other reference track and such tiles are oriented in the first direction; and
assigning such unassigned tiles to the next bin.

29. The method of claim 28 further comprising the steps of:
repeating the selecting, providing and assigning steps of claim 28 with subsequent reference tracks until all tiles have been assigned to a corresponding bin.

30. The method of claim 29 further comprising the steps of:
associating tiles in each bin using a bin R-tree corresponding to each bin.

31. The method of claim 30 further comprising the step of:
associating root nodes of each bin R-tree which corresponds to a bin having a first orientation using a first direction R-tree; and
associating root nodes of each bin R-tree which corresponds to a bin having a second orientation using a second direction R-tree.

32. The method of claim 31 further comprising the step of:
associating root nodes of each direction R-tree corresponding to a layer of the circuit design area using a layer R-tree.

33. The method of claim 32 further comprising the steps of:
associating root node of the layer R-tree with at least one root node of at least one other layer R-tree to provide a global geometry database defining at least in part a physical layout of the circuit.

* * * * *